(12) United States Patent
Herron et al.

(10) Patent No.: US 7,198,730 B2
(45) Date of Patent: Apr. 3, 2007

(54) PHOSPHORESCENT MATERIAL

(75) Inventors: Norman Herron, Newark, DE (US); Nora Sabina Radu, Landenberg, PA (US); Eric Maurice Smith, Wilmington, DE (US); Ying Wang, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 144 days.

(21) Appl. No.: 10/650,323

(22) Filed: Aug. 28, 2003

(65) Prior Publication Data

US 2005/0048312 A1    Mar. 3, 2005

(51) Int. Cl.
    *C09K 11/06*    (2006.01)
    *H01L 51/54*    (2006.01)

(52) U.S. Cl. .................. 252/301.16; 546/4; 556/21; 556/22; 556/23; 428/690; 428/917; 313/504; 257/E51.044

(58) Field of Classification Search .................. None
See application file for complete search history.

(56) References Cited

U.S. PATENT DOCUMENTS

| | | |
|---|---|---|
| 2001/0019782 A1 | 9/2001 | Igarashi et al. |
| 2001/0053462 A1 | 12/2001 | Mishima |
| 2002/0022149 A1 | 2/2002 | Watanabe et al. |
| 2002/0024293 A1 | 2/2002 | Igarashi et al. |
| 2002/0034656 A1 | 3/2002 | Thompson et al. |
| 2002/0048689 A1 | 4/2002 | Igarashi et al. |
| 2002/0055014 A1 | 5/2002 | Okada et al. |
| 2002/0063516 A1 | 5/2002 | Tsuboyama et al. |
| 2002/0064681 A1 | 5/2002 | Takiguchi et al. |
| 2002/0068190 A1 | 6/2002 | Tsuboyama et al. |
| 2002/0182441 A1 | 12/2002 | Lamansky et al. |
| 2003/0017381 A1 | 1/2003 | Thompson et al. |
| 2003/0059646 A1 | 3/2003 | Kamatani et al. |
| 2003/0068526 A1 | 4/2003 | Kamatani et al. |
| 2003/0162299 A1 | 8/2003 | Hsieh et al. |

FOREIGN PATENT DOCUMENTS

| | | |
|---|---|---|
| EP | 1 191 612 A2 | 3/2002 |
| EP | 1 191 613 A2 | 3/2002 |
| EP | 1 191 614 A2 | 3/2002 |
| EP | 1 348 711 A1 | 10/2003 |
| EP | 1 349 435 A1 | 10/2003 |
| JP | 2003-73387 A | 3/2003 |
| WO | WO 00/70655 A2 | 11/2000 |
| WO | WO 01/41512 A1 | 6/2001 |
| WO | WO 02/15645 A1 | 2/2002 |
| WO | WO 02/074015 A2 | 9/2002 |
| WO | WO 03/000661 A1 | 1/2003 |

OTHER PUBLICATIONS

Lee, Hae Won et al., Electrophosphorescent Light Emitting Devices Using Mixed Ligand Ir(III) Complexes, Mat. Res. Soc. Sym. Proc., 2002, 119-123, 708, Materials Research Society.

Grundemann, Stephan et al., Abnormal Ligand Binding and Reversible Ring Hydrogenation in the Reaction of Imidazolium Salts with $IrH_3(PPh_3)_2$, J. Am. Chem. Soc., 2002, 10473-10481, 124, American Chemical Society.

Kawamura, Yuichiro et al., Energy transfer in polymer electrophosphorescent light emitting devices with single and multiple doped luminescent layers, Joural of Applied Physics, Jul. 1, 2002, 87-93, 92(1), American Institute of Physics.

Lamansky, Sergey et al., Cyclometalated Ir complexes in polymer organic light-emitting devices, Journal of Applied Physics, Aug. 1, 2002, 1570-1575, 92(3), American Institute of Physics.

*Primary Examiner*—Marie Yamnitzky
(74) *Attorney, Agent, or Firm*—John H. Lamming

(57) ABSTRACT

A luminescent organometallic complex composition of matter, a method of preparing this composition of matter, and an electronic device built with this composition of matter. The composition includes:
    at least one transition metal that produces phosphorescent emission at room temperature,
    at least one first monoanionic bidentate ligand coordinated through a nitrogen on a heteroaromatic ring and a carbon, and
    at least one second ligand selected from a hydride and a ligand coordinated through a carbon atom which is part of an aromatic group.

5 Claims, 4 Drawing Sheets

PHOSPHORESCENT MATERIAL

BACKGROUND OF THE INVENTION

1. Field of the Invention

The invention relates generally to a transition metal complex and more particularly to a transition metal complex used in an electronic device.

2. Background Information

Research and development relating to various kinds of display devices are actively carried out today. In particular, organic electroluminescent elements have received attention as promising display elements because of their ability to emit light at a low voltage. For example, a light-emitting device having an organic thin film formed by vapor deposition of an organic compound has been known (*Applied Physics Letters,* Vol. 51, p. 913 (1987)). Research has revealed that high power efficiency organic electroluminescent devices, such as organic light emitting diode (OLED) devices, can be made using molecules that emit light from their triplet state.

Light emission from the triplet state, as opposed to light emission from the singlet state, is referred to as phosphorescence. The triplet excitons can produce phosphorescence, whereas the singlet excitons typically produce fluorescence. Since the lowest emissive singlet excited state of an organic molecule is typically at a slightly higher energy than the lowest triplet excited state, the singlet excited state may relax, by an intersystem crossing process, to the emissive triplet excited state. This means that all the exciton excitation energy may be converted into triplet state excitation energy, which then becomes available as phosphorescent emission. Since all the exciton excitation energy can become available as electrophosphorescence, electrophosphorescent devices have a maximum theoretical quantum efficiency of 100%.

In recent years, much effort has been geared to application of organic electroluminescent devices to full color displays and white light sources. As known, full color display devices require red, green, and blue light sources (RGB). Thus, in order to produce a full color display that takes advantage of the high power efficiency of organic electroluminescent devices, a triplet emissive blue is needed as well as high efficiency triplet emissive red and green materials. Examples of triplet emissive red and green materials are already in existence. However, triplet emissive blue has been difficult to attain due to the high energy of the emissive state. Efficient long-lived blue-light emitters with good color coordinates are a recognized current shortfall in the field of organic electroluminescent devices.

Although some light-emitting devices have been reported to emit blue light, there has been no report of blue light-emitting device having an external quantum efficiency exceeding 5%. If a blue light-emitting device having an external quantum efficiency exceeding 5% could be provided, application of light-emitting devices would be greatly expanded. Moreover, it would be possible to significantly reduce electrical power consumption, since electrical appliances use these electroluminescent devices.

SUMMARY OF THE INVENTION

The invention is a novel luminescent composition of matter, a method of preparing this composition of matter, and an electronic device built with this composition of matter. The composition is an organometallic complex comprising:

at least one transition metal M that produces phosphorescent emission at room temperature, at least one first monoanionic bidentate ligand coordinated through a nitrogen on a heteroaromatic ring and a carbon, and at least one second ligand selected from a hydride and a ligand coordinated through a carbon atom which is part of an aromatic group.

The electronic device of the invention includes a photoactive layer, between two electrode layers and a layer of charge transport material located between the photoactive layer and each electrode layer, wherein at least one of the photoactive layer, the electrode layer, and the layer of charge transport material includes the organometallic complex described above.

One embodiment of the above composition of matter is prepared by mixing 2-(2,4-difluorophenyl)-4-methylpyridine with iridium chloride to form a mixture, adding triphenylphosphine and sodium bicarbonate to the mixture, drying the mixture, and extracting the mixture into methylene chloride.

Other features and advantages of the invention will be apparent from the following detailed description, and from the claims.

DETAILED DESCRIPTION

Figure 1:
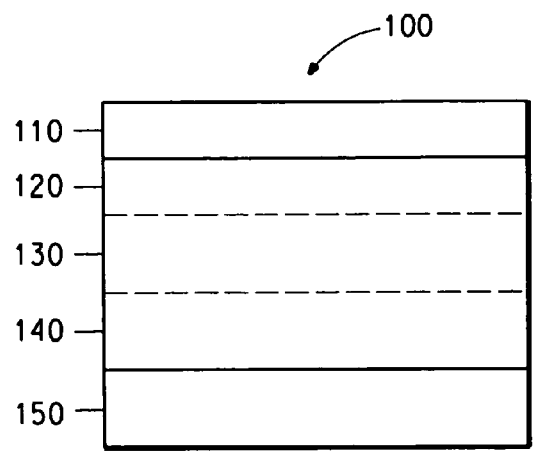
FIG. 1 is an exemplary organic light emitting diode (OLED) device that may include the organometallic complex of the invention.

Unless otherwise defined, all technical and scientific terms used herein have the same meaning as commonly understood by one of ordinary skill in the art to which this invention belongs. In the formulae, all letters not otherwise defined, are used to designate conventional atomic symbols. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

"Blue," as used herein, indicates any color that appears bluish to the naked human eye, including light of wavelengths ranging from 440 nm to 540 nm. A "luminescent material" is a material that emits light when activated by an applied voltage (such as in a light-emitting diode or light-emitting electrochemical cell) or in response to radiant energy. An "organometallic complex," as used herein, is a metal atom having organic ligands. "Room temperature," as used herein, is a temperature between 15–35° C. at about 1 atmosphere pressure. "Peak efficiency," as used herein, is the highest point of a curve in an efficiency-vs.-voltage curve, provided in units of cd/A. Peak efficiency is generally used to indicate the number of photons emitted per electrons injected. "Peak radiance" is the highest point of a curve in an radiance-vs-voltage curve, provided in units of $cd/m^2$. It signifies the amount of light (the number of photons) that are emitted per unit area. "Phosphorescent emission" as used herein, is emission from an excited state having a lifetime between 10 nanoseconds and 10 microseconds.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Organometallic Complex

The compositions of the invention comprise a transition metal element M, at least one first ligand which is a monoanionic bidentate ligand coordinated through a nitrogen on a heteroaromatic ring and a carbon, at least one second ligand selected from a hydride and a ligand coordinated through a carbon atom which is part of an aromatic group Formula IV shows an exemplary general structure of the compositions of the invention, wherein the metal is a transition metal listed in Groups 3–12 of the Periodic Table, and the first ligand is represented by C—N. The IUPAC numbering system is used throughout, where the groups from the Periodic Table are numbered from left to right as 1–18 (CRC Handbook of Chemistry and Physics, $81^{st}$ Edition, 2000). In the figure, A represents a monoanionic ligand attachment and B represents a nonionic ligand attachment, wherein at least one of A is a hydride or a carbon atom which is part of an aromatic group, and further wherein one or more of the A's and B's can be bonded together with linking groups.

In one embodiment, M is a transition metal that produces an efficient phosphorescent emission at room temperature from a mixture of metal-to-ligand charge transfer and Π–Π* ligand states. In another embodiment, the phosphorescent emission at room temperature may result from a mixture of ligand-to-metal charge transfer and Π–Π* ligand states. In one embodiment, M is a metal selected from Groups 8 through 11. In one embodiment, M is a metal selected from Ir, Rh, Ru, and Os.

In one embodiment, the first ligand is an aryiheterocycle or a heteroaryiheterocycle. In one embodiment, the first ligand is selected from ligands having Formula I or Formula II below.

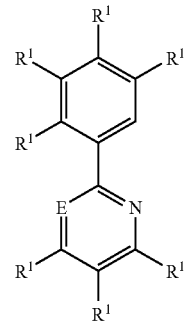

Formula I

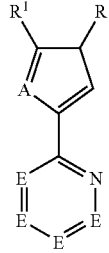

Formula II wherein:
$R^1$ is the same or different at each occurrence and is selected from H, D, $C_nH_{2n+1}$, $C_nH_{n-1}$, $OR^2$, $SR^2$, $N(R^2)_2$, F, $C_n(H+F)_{2+1}$, $OC_n(H+F)_{2n+1}$, $OC_nH_{n-1}$, and $OCF_2X$, or adjacent pairs of $R^1$ can be joined to form a five- or six-membered ring;
$R^2$ is the same or different at each occurrence and is H, $C_nH_{2n+1}$, or $C_n(H+F)_{2n+1}$;
A is S or $NR^2$; E is the same or different at each occurrence and is N or $CR^1$;
X is H, Cl, or Br; and
n is an integer from 1 through 20.

The first ligand may be selected from phenylpyridines, phenylpyrimidines, and phenylquinolines or phenylisoquinolines, which may have $R^1$ substituents as discussed above.

In one embodiment, the second ligand is a ligand having the general Formula III $$Ar[—(CH_2)_m—Y]_p \quad \text{Formula III}$$

wherein Ar is an aromatic group, Y is a group having a heteroatom capable of coordinating to metal M, m is 0 or an integer from 1 through 20, p is an integer from 1 through 5, and further wherein one or more of the carbons in $(CH_2)_m$ can be replaced with a heteroatom and one or more of the hydrogens in $(CH_2)_m$ can be replaced with D or F.

In one embodiment, Y is selected from $NR^2_2$, $OR^2$, $SR^2$, and $PR^3_2$, wherein $R^2$ is the same or different at each occurrence and is H, $C_nH_{2n+1}$ or $C_n(H+F)_{2n+1}$ and $R^3$ is the same or different at each occurrence and is selected from H, $R^2$, Ar and substituted Ar.

In one embodiment, Ar is phenyl, m is 1, Y is $P(Ar)_2$, and p is 1 or 2.

The organometallic complexes of the invention can comprise additional ligands coordinated to metal M. These can be any conventional ligand and can be neutral or anionic. In one embodiment, the organometallic complex is an overall neutral molecule, and the additional ligands have the correct charge to balance the charges of the metal and other ligands.

Examples of suitable additional ligands include, but are not limited to, permutations of amines, phosphines, alkoxides, halides, hydrides or orthometalated aryl groups.

In one embodiment, the composition can be represented by formula IV below:

Formula IV

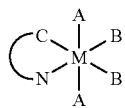

wherein M represents a metal as described above, C—N represents the first ligand, A represents a monoanionic ligand attachment, B represents a nonionic ligand attachment, A's and B's can be linked together in any combination, and at least one of A is a hydride or carbon which is part of an aromatic group. In one embodiment, M is one of Ir, Rh, Ru, and Os. Examples of different A and B linkages are given in Formulae IV(a) through IV(d) below.

Formula IV(a)

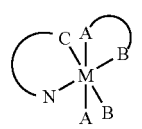

Formula IV(b)

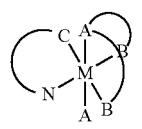

Formula IV(c)

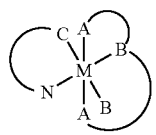

Formula IV(d)

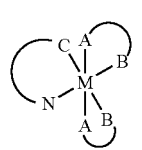

In one embodiment, the ligands and the metal form a neutral complex that, in many cases, can provide blue photo-luminescence and electro-luminescence The emitted color is tuned by combinations of electron-donating and electron-withdrawing substituents, and is generally at a shorter wavelength for these mono-phenylpyridino complexes than for the corresponding bis- or tris-cyclometalated phenylpyridino complexes.

Good color coordinates for blue emission are realized. Desirable color coordinate ranges for a blue material, which are typically $0.1<X<0.25$ and $Y<0.22$, according to the 1931 CIE convention, have been achieved.

These organometallic complexes can generally be synthesized by a sequential reaction sequence. For example, an iridium hydride complex can be synthesized using the following generalized steps. Iridium trichloride and the selected phenylpyridino type first ligand are mixed in a molar ratio of 1:1 in a mixed solvent of water:2-ethoxyethanol 1:9 by volume. This mixture is refluxed under a nitrogen atmosphere for between 15 and 60 mins. The reaction mixture is then cooled and 2 molar equivalents of an additional ligand are added along with >3 molar equivalents of sodium bicarbonate. The mixture is then further refluxed under nitrogen for another period of 15–60 mins. The mixture is then cooled and the water/ethoxyethanol solvent removed by evaporation leaving a solid residue. Extraction of this residue into methylene chloride and filtration provides a solution of the desired emissive complex. Standard purification (recrystallization from methylene chloride/methanol mixtures or silica chromatography using methylene chloride eluent) results in the purified complex for testing as an electroluminescent material.

Electronic Device

The organometallic complex described above may be incorporated into an electronic device. More specifically, this organometallic complex may be used in the light emitting layer either as the host material or the luminescent material, or in an electron transport layer. FIG. 1 is an exemplary electronic device 100 that includes a photoactive layer positioned between two electrical contact layers, wherein one of the layers of the device contains the organometallic complex. The electronic device 100 includes a hole transport layer 120 located between the photoactive layer 130 and an anode layer 110, and an electron transport layer 140 located between the photoactive layer 130 and a cathode layer 150. Depending on the application of the device 100, the photoactive layer 130 can be a light-emitting layer that is activated by an applied voltage (such as in a light-emitting diode or light-emitting electrochemical cell), a layer of material that responds to radiant energy and generates a signal with or without an applied bias voltage (such as in a photodetector). Examples of photodetectors include photoconductive cells, photoresistors, photoswitches, phototransistors, phototubes, and photovoltaic cells, as described in Markus, John, *Electronics and Nucleonics* Dictionary, 470 and 476 (McGraw-Hill, Inc., 1966). The device is not limited with respect to system, driving method, and utility mode.

The electron transport layer 140 may contain a material having an ionization potential of 5.9 eV or more, more preferably from 6.0 to 7.0 eV. The hole transport layer 120 may contain a metal, an alloy, a metallic oxide, an electroconductive compound, or a mixture thereof, and preferably a material having a work function of 4 eV or more. Examples of materials that are useful for electron transport layer 140 include metal chelated oxinoid compounds, such as tris(8-hydroxyquinolato)aluminum ($Alq_3$); phenanthroline-based compounds, such as 2,9-dimethyl-4,7-diphenyl-1,10-phenanthroline (DDPA) or 4,7-diphenyl-1,10-phenanthroline (DPA), and azole compounds such as 2-(4-biphenylyl)-5-(4-t-butylphenyl)-1,3,4-oxadiazole (PBD) and 3-(4-biphenylyl)-4-phenyl-5-(4-t-butylphenyl)-1,2,4-triazole (TAZ). The electron transport layer 140 can function both to facilitate electron transport and to serve as a buffer layer or confinement layer that prevents quenching of the exciton at layer interfaces. Preferably, the electron transport layer 140 promotes electron mobility and reduces exciton quenching.

Examples of hole transport layer 120 are provided in, for example, Kirk-Othmer Encyclopedia of Chemical Technology, Fourth Edition, Vol. 18, p. 837–860, 1996. Both hole transporting molecules and polymers can be used. Commonly used hole transporting molecules are: N,N'-diphenyl-N,N'-bis(3-methylphenyl)-[1,1'-biphenyl]-4,4'-diamine (TPD), 1,1-bis[(di-4-tolylamino) phenyl]cyclohexane (TAPC), N,N'-bis(4-methylphenyl)-N,N'-bis(4-ethylphenyl)-[1,1'-(3,3'-dimethyl)biphenyl]-4,4'-diamine (ETPD), tetrakis-(3-methylphenyl)-N,N,N',N'-2,5-phenylenediamine (PDA), a phenyl-4-N,N-diphenylaminostyrene (TPS), p-(diethylamino)benzaldehyde diphenylhydrazone (DEH), triphenylamine (TPA), bis[4-(N,N-diethylamino)-2-methylphenyl](4-methylphenyl)methane (MPMP), 1-phenyl-3-[p-(diethylamino)styryl]-5-[p-(diethylamino)phenyl] pyrazoline (PPR or DEASP), 1,2-trans-bis(9H-carbazol-9-yl)cyclobutane (DCZB), N,N,N',N'-tetrakis(4-methylphenyl)-(1,1'-biphenyl)-4,4'-diamine (TTB), and porphyrinic compounds, such as copper phthalocyanine. Commonly used hole transporting polymers are polyvinylcarbazole, (phenylmethyl)polysilane, and polyaniline. It is also possible to obtain hole transporting polymers by doping hole transporting molecules such as those mentioned above into polymers such as polystyrene and polycarbonate.

The anode layer 110 is generally formed as a layer on a transparent substrate, such as soda lime glass, non-alkali glass or a transparent resin substrate. The cathode is selected in consideration of adhesion to the adjacent layer. The cathode may be made of material such as metals, alloys, metallic halogenides, metallic oxides, electroconductive compounds, and mixtures thereof. Methods of forming the anode and the cathode are well known.

The organometallic complex of the invention is particularly useful in the photoactive layer 130 or in the electron transport material layer 140. The organometallic complex may be used as the light-emitting material in diodes. The layer that contains the organometallic complex may also contain other compounds. In some cases, the organometallic complex may be present in more than one isomeric form, or mixtures of different complexes may be present.

The method for forming the layer containing the organometallic complex is not particularly limited, and various methods, such as a vacuum deposition method, a Langmuir-Blodgett (LB) method, a resistance heating vapor deposition method, an electron beam method, a sputtering method, a molecular accumulation method, a coating method (such as a spin coating method, a casting method and a dip coating method), an ink jet method and a printing method, can be utilized. A resistance heating vapor deposition method and a coating method are preferred from the standpoint of characteristics and production. In particular, the coating method is advantageous in that production cost may be reduced when the light-emitting element is applied to a technology that requires a large area, such as a display.

The layer can be formed by the coating method in the following manner. The organometallic complex is dissolved in a solvent to prepare a coating composition, which is then coated on a desired layer and dried. This drying usually involves initial evaporation of solvent under ambient—room temperature and pressure conditions but may optionally also involve heating at temperatures of up to 80° C. and/or vacuum drying at reduced pressures down to $10^{-6}$ torr. Such heating can be done in a vacuum oven, on a hot plate etc. The coating composition may contain a resin, and the resin may be in a dissolved state in the solvent or in a dispersed state therein. Examples of the resin include a non-conjugated system polymer (such as polyvinyl carbazole) and a conjugated system polymer (such as a phenylenevinylene or fluorene polymer).

The invention will be further described in the following examples, which do not limit the scope of the invention described in the claims.

EXAMPLES

Example 1

This example provides a method of synthesizing an organometallic complex of the invention, wherein M is Ir, the first ligand is a phenylpyridine, the second ligand is a hydride, and three additional ligands which are triphenylphosphine or chloride ion.

0.42 g of 2-(2,4-difluorophenyl)-4 methylpyridine was mixed with 0.76 g iridium chloride in 10 mL 2-ethoxyethanol and 1 mL water. The mixture was refluxed under nitrogen for 30 minutes. The mixture was then cooled to room temperature, and 1.1 g triphenylphosphine and 500 mg sodium bicarbonate were added. The resulting new mixture was refluxed for 1 hour, again under nitrogen, cooled to room temperature, and evaporated to dryness in a nitrogen stream. The mixture was then extracted into methylene chloride and filtered. The filtered solution was evaporated to dryness and chromatographed on silica to collect the fast running blue luminescent band.

Figure 2:
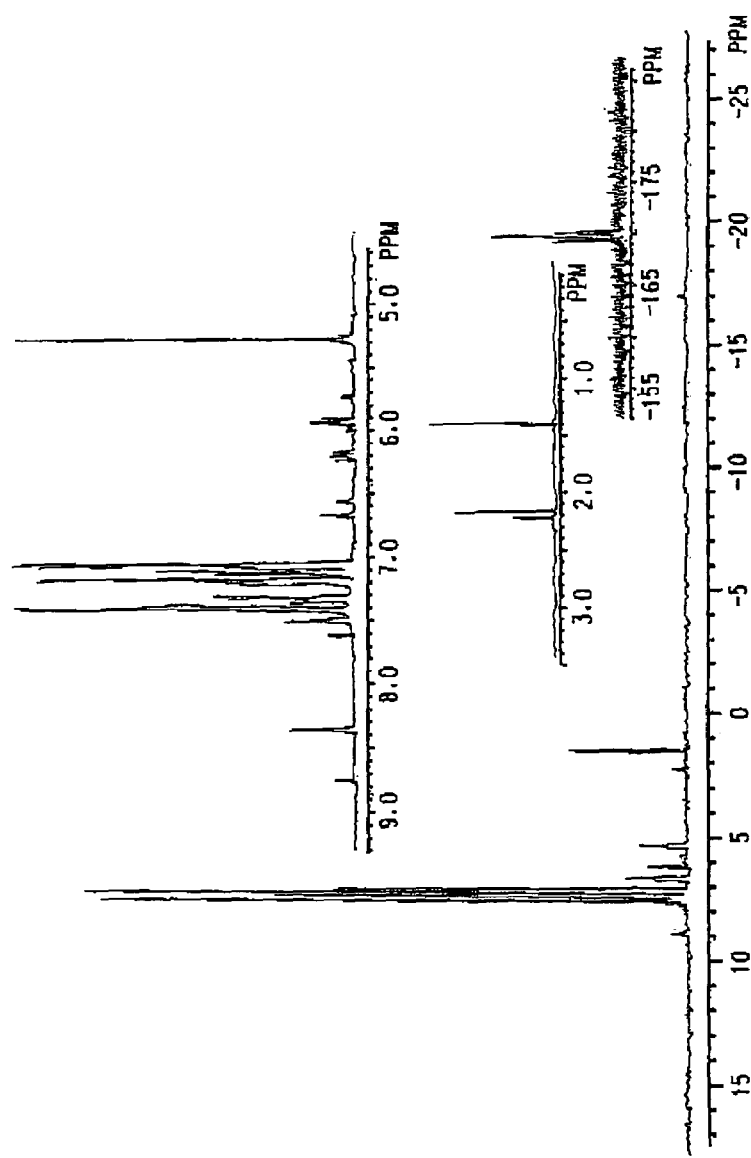
FIG. 2 is an NMR spectroscopy result of a product containing the organometallic complex of the invention.

The crude product was a mixture of a blue luminescent and a red/orange poorly-luminescent fraction. The NMR of the product, shown in FIG. 2, indicates the presence of both a hydride and a non-hydride coordination complex, both of which are monocyclometallated and with two phosphines coordinated. FIG. 2, indicates the composition of the product and shows that the product contains the chloride-hydride and the dichloride products, with the dichloride being the dominant material ($Cl_2$:Cl—H=~2:1). The chloride-hydride and the dichloride products were separated by recrystallization from methylene chloride/methanol mixtures. Alternately, separation may be achieved by further chromatography on a silica column using methylene chloride as eluent. The dichloride product was the red-orange poorly-luminescent and fastest running eluate from the column while the hydrido-chloride product was the next eluate and was brightly blue luminescent.

Figure 3:
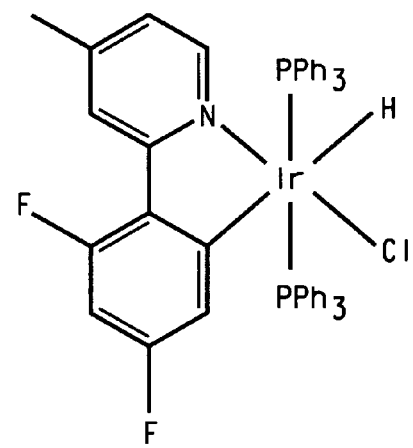
FIG. 3 is a first exemplary organometallic complex capable of emitting blue light.
Figure 4:
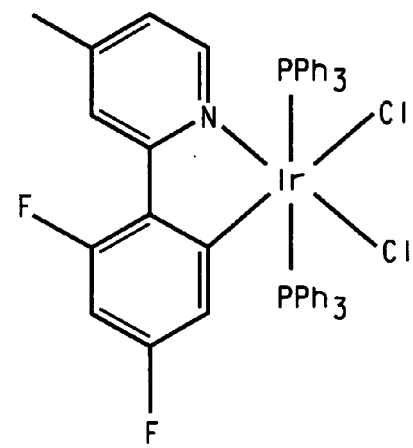
FIG. 4 is a relative of the organometallic complex of FIG. 3 that does not include a hydride ligand.

FIG. 3 is the structure of the brightly blue luminescent fraction, wherein the second ligand is a hydride. FIG. 4 is the structure of the poorly-luminescent fraction, which is the non-hydride. The poorly-luminescent fraction is not a compound of the invention, as there is no second ligand selected from hydride or aromatic carbon.

An OLED device built with this complex emitted light at about 500 nm and 580 nm. The LED peak efficiency was about 0.05 cd/A, and the peak radiance was about 14 $cd/m^2$.

Example 2

Figure 5:
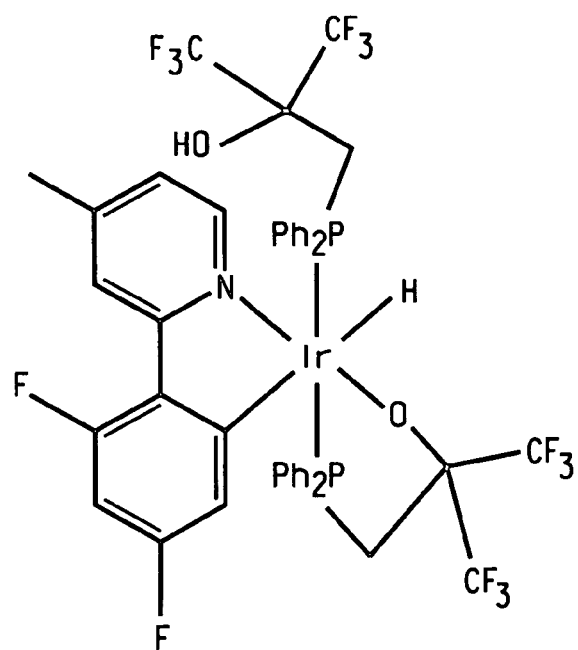
FIGS. 5, 6, 7, 8, and 9, are other exemplary organometallic complexes of the invention capable of emitting blue light.

This example provides a method of synthesizing an organometallic complex of the invention having the structure illustrated in FIG. 5.

0.21 g of the ligand 4-methyl-2-(2,4-difluorophenyl)pyridine and 0.38 g iridium chloride were refluxed in 0.5 mL of water and 4.5 mL of 2-ethoxyethanol. After 1 hour of reflux under nitrogen 0.1 g, sodium bicarbonate and 0.73 g 2-diphenylphosphino-1,1-bistrifluoromethyl-ethanol were added and the reflux was continued for approximately 30 minutes after the addition. The solvent was removed by evaporation in dry nitrogen and the resulting solid was dissolved in a minimum of methylene chloride. The solution was chromatographed on a silica column using methylene chloride as eluent. The fastest running blue luminescent band was collected and the solid recovered by evaporation was recrystallized from methylene chloride/methanol to yield pale yellow blocks. The yield was ~25%. Crystal structure analysis revealed the structure shown in FIG. 5.

An OLED device built with this complex emitted light at about 440 nm, 470 nm, and 500 nm. The LED peak efficiency ranged between 0.6–1.5 cd/A and the peak radiance was 35 cd/m². The 1931 CIE x,y coordinates were (0.167, 0.235)

Example 3

This example illustrates how to produce organometallic complexes of alternate structures and to alter the overall yield by varying the reagents.

Figure 6:
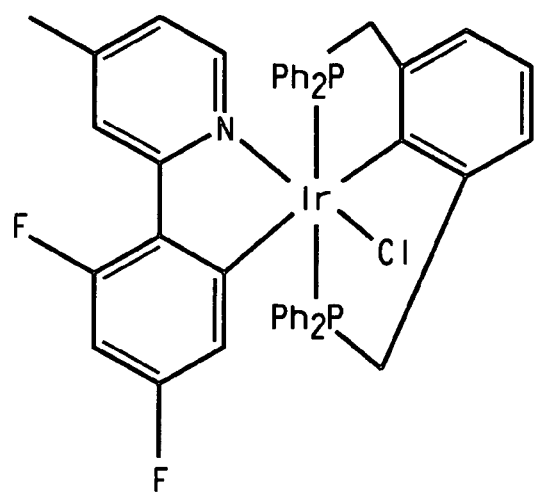

The procedure described in Example 2 was repeated except that 0.25 g sodium bicarbonate and 0.48 g of α,α'-diphenylphosphino-m-xylene were used in place of the 2-diphenylphosphino-1,1-bistrifluoromethylethanol. After recrystallization of the chromatographed blue luminescent fraction needle crystals were obtained in ~35% yield and a single crystal structure determined the struture to be that shown in FIG. 6, where the second ligand is a carbon which is part of a phenyl ring.

When built into an OLED device, this complex emitted light at about 450 nm, 480 nm, and 590 nm. The LED peak efficiency was 0.6–0.7 cd/A and the peak radiance was 400 cd/m². Color coordinates of the emitted blue light were about (0.191, 0.353) to (0.266, 0.433).

Example 4

Figure 7:
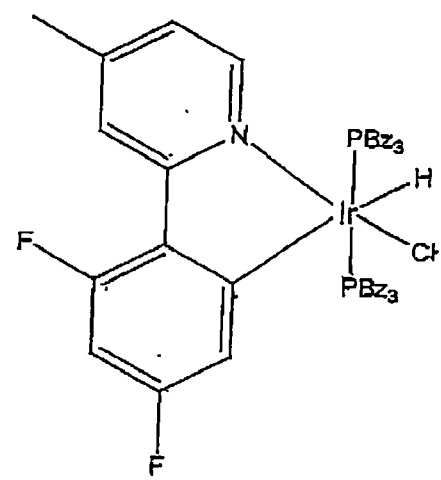

This example provides a method of synthesizing an organometallic complex of the invention having the structure is illustrated in FIG. 7.

0.42 g of 2-(2,4-difluorophenyl)-4-methylpyridine was mixed with 0.76 g iridium chloride in 10 mL 2-ethoxyethanol and 1 mL water. The mixture was refluxed under nitrogen for 30 minutes. The mixture was then cooled to room temperature, and 1.2 g tribenzylphosphine and 500 mg sodium bicarbonate were added. The resulting new mixture was refluxed for 1 hour, again under nitrogen, cooled to room temperature, and evaporated to dryness in a nitrogen stream. The mixture was then extracted into methylene chloride and filtered. The filtered solution was evaporated to dryness and chromatographed on silica to collect the various blue luminescent bands.

The crude product was a mixture of several blue luminescent materials. Separation may be achieved by repeated chromatography on a silica column using methylene chloride as eluent. The first product is that shown in FIG. 7 as determined by x-ray crystallography The complex can be built into an organic light emitting diode (OLED) device. When the complex was built into an OLED device having an approximately 303-Å layer of MPMP and an approximately 400-Å layer of DPA, the device generated light with an LED peak efficiency of 0.5 cd/A at 20 V. The peak radiance of the device was 1.3 cd/m².

Example 5

Figure 8:
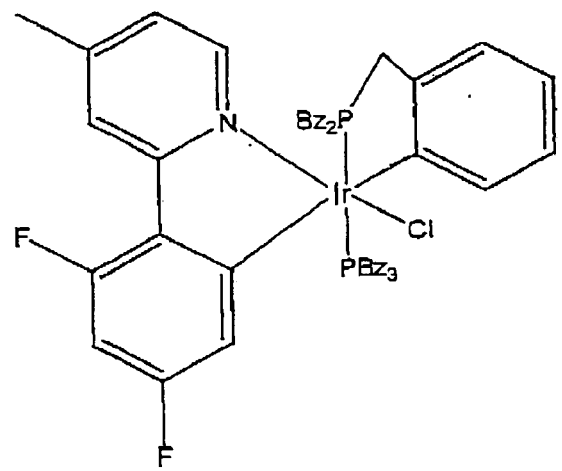

This example provides a method of synthesizing an organometallic complex of the invention having the structure illustrated in FIG. 8.

The procedure of Example 4 was repeated and a second blue luminescent material was isolated from the column chromatography. This material has the structure shown in FIG. 8.

The properties of the emitted blue light vary depending on the structure of the complex that is included in the light emitting layer. For example, when the complex of FIG. 8 was built into an OLED device that is substantially similar to the device of Example 4, the resulting device generated a blue-green light having $\lambda_{max}$=505 nm and an LED peak efficiency of 0.6 cd/A at 10 V. The peak radiance of this device was 70 cd/m² at 12 V. The device included an approximately 303-Å layer of MPMP and an approximately 402-Å layer of DPA.

Example 6

Figure 9:
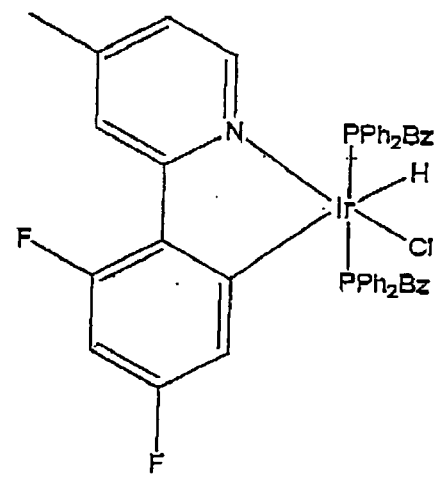

This example provides a method of synthesizing an organometallic complex of the invention, having the structure provided in FIG. 9.

0.42 g of 2-(2,4-difluorophenyl)-4 methylpyridine was mixed with 0.76 g iridium chloride in 10 mL 2-ethoxyethanol and 1 mL water. The mixture was refluxed under nitrogen for 30 minutes. The mixture was then cooled to room temperature, and 1.2 g diphenylbenzylphosphine and 500 mg sodium bicarbonate were added. The resulting new mixture was refluxed for 1 hour, again under nitrogen, cooled to room temperature, and evaporated to dryness in a nitrogen stream. The mixture was then extracted into methylene chloride and filtered. The filtered solution was evaporated to dryness and chromatographed on silica to collect the various blue luminescent bands.

The crude product was a mixture of several blue luminescent materials. Separation was achieved by chromatography on a silica column using methylene chloride as eluent. The first product was that shown in FIG. 9, as determined by nmr spectroscopy Depending on the structure of the complex, the OLED device built with the complex may have multiple luminescence peaks. When the complex of FIG. 9 was built into an OLED device including an approximately 302-Å layer of MPMP and an approximately 261-Å layer of DPA, the device generated light having $\lambda_{max}$=505 nm and 580 nm, with an LED peak efficiency of 0.7 cd/A at 11 V. The peak radiance of this device was 60 cd/m² at 15 V.

The invention claimed is:

1. A luminescent organometallic complex composition of matter, the composition comprising
    at least one transition metal, M, that produces phosphorescent emission at room temperature;
    at least one first monoanionic bidentate ligand coordinated through a nitrogen on a heteroaromatic ring and a carbon which is part of an aromatic group; and
    at least one second ligand, coordinated through a carbon atom on an aromatic group and having Formula III

Formula III wherein
    Ar is an aromatic group,
    Y is a group having a heteroatom capable of coordinating to metal M,
    m is an integer from 1 through 20,
    p is an integer from 1 through 5,
    and further wherein one or more of the hydrogens in $(CH_2)_m$ can be replaced with D or F, wherein Y is selected from $NR^2{}_2$, $OR^2$, $SR^2$, and $PR^3{}_2$, wherein $R^2$ is the same or different at each occurrence and is H or $C_nH_{2n+1}$; and
    $R^3$ is the same or different at each occurrence and is selected from H, $R^2$, and Ar.

2. The composition of claim 1, wherein M is iridium, the first ligand is phenylpyridine with substituents, the second ligand is α,α'-diphenylphosphino-m-xylene.

3. The composition of claim 1, wherein Ar is phenyl, m is 1, Y is P(Ar)$_2$, and p is 1 or 2.

4. A luminescent organometallic complex composition of matter, the composition comprising
  iridium;
  at least one first ligand which is a phenylpyridine with substituents;
  at least one second hydride ligand; and
  two diarylbenzylphosphine ligands.

5. A luminescent organometallic complex composition of matter selected from:

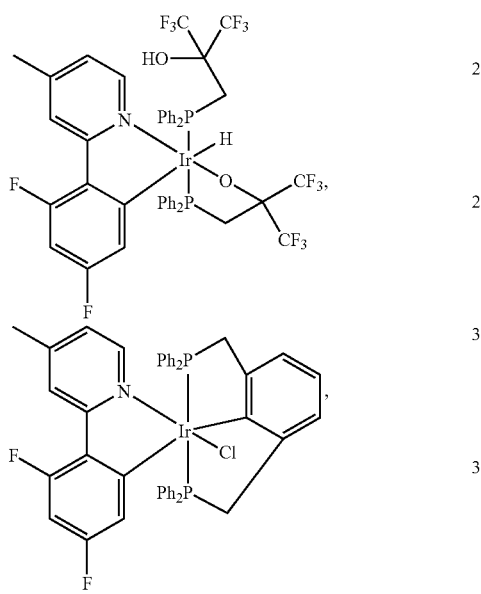

-continued

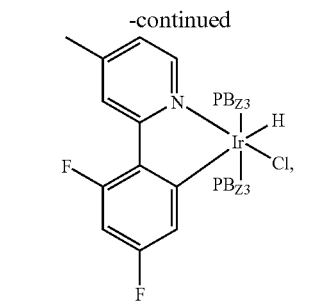

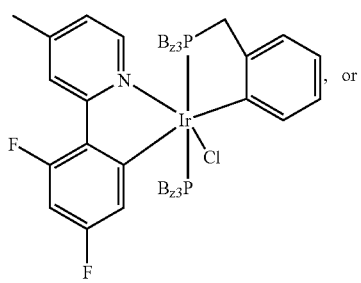

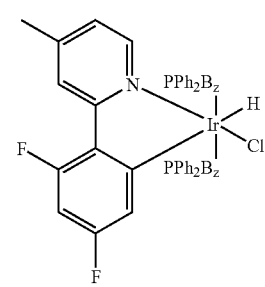

where Ph is phenyl and Bz is benzyl.

* * * * *